(12) United States Patent
Jau et al.

(10) Patent No.: US 10,149,401 B2
(45) Date of Patent: Dec. 4, 2018

(54) INTERCHANGEABLE MODULES FOR CABLE MANAGEMENT

(71) Applicant: Quanta Computer Inc., Taoyuan (TW)

(72) Inventors: Maw-Zan Jau, Taoyuan (TW); Chih-Da Wu, Taoyuan (TW); Shuen-Hung Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 237 days.

(21) Appl. No.: 14/724,989

(22) Filed: May 29, 2015

(65) Prior Publication Data

US 2016/0353603 A1 Dec. 1, 2016

(51) Int. Cl.
*G06F 13/00* (2006.01)
*H05K 7/14* (2006.01)

(52) U.S. Cl.
CPC ................... *H05K 7/1491* (2013.01)

(58) Field of Classification Search
None
See application file for complete search history.

(56) References Cited

U.S. PATENT DOCUMENTS

| | | | | |
|---|---|---|---|---|
| 5,359,489 A * | 10/1994 | Hass | | H05K 7/16 361/732 |
| 6,134,612 A * | 10/2000 | Bailey | | G06F 1/1632 710/2 |
| 6,411,506 B1 * | 6/2002 | Hipp | | G06F 1/183 174/261 |
| 6,757,748 B1 * | 6/2004 | Hipp | | G06F 1/183 370/419 |
| 6,937,461 B1 * | 8/2005 | Donahue, IV | | H01R 13/514 174/50 |
| 9,722,381 B1 * | 8/2017 | Moen | | H01R 33/88 |
| 2003/0048614 A1 * | 3/2003 | Garnett | | G06F 1/183 361/724 |
| 2003/0154112 A1 * | 8/2003 | Neiman | | G06F 9/5044 705/5 |
| 2009/0213544 A1 * | 8/2009 | Dittus | | H05K 7/20727 361/695 |
| 2011/0013348 A1 * | 1/2011 | Seibold | | G06F 1/189 361/679.02 |
| 2011/0266933 A1 * | 11/2011 | Hanna | | G06F 1/186 312/223.2 |
| 2013/0078624 A1 * | 3/2013 | Holmes | | C12Q 1/00 435/6.11 |
| 2016/0127167 A1 * | 5/2016 | Chou | | H04L 41/0226 709/223 |

* cited by examiner

*Primary Examiner* — Michael Sun
(74) *Attorney, Agent, or Firm* — Nixon Peabody LLP; Eduardo J. Quiñones (57) ABSTRACT

A system includes a rear panel of a housing that includes a first compartment and a second compartment. The system further includes a first module of a first type coupled to the first compartment and a second module of a second type coupled to the second compartment. The first compartment is configured to couple to modules of the first type and the second type, and the second compartment is configured to couple to modules of the first type and the second type.

21 Claims, 5 Drawing Sheets

INTERCHANGEABLE MODULES FOR CABLE MANAGEMENT

BACKGROUND

Field

This application relates to computer systems, and more particularly to a system and method for cable management in server rack architecture.

Background

Computer server systems in modern data centers are commonly mounted in specific configurations on server racks for which a number of computing modules, such as server trays, server chassis, server sleds, server blades, etc., are positioned and stacked relative on top of each other within the server racks. Rack mounted systems allow for a vertical arrangement of the computing modules to use space efficiently. Generally, each computing module can be slid into and out of the server rack, and various cables such as input/output (JO) cables, network cables, power cables, etc., can connect to the computing modules at the front or rear of the rack. Each computing module can contain one or more computer servers or may hold one or more computer server components. For example computing modules can include hardware circuitry for processing, storage, network controllers, disk drives, cable ports, power supplies, etc. A large number of cables can be coupled to the computing modules mounted on each server rack. Typically the cables are routed in an organized manner behind each server rack. However, when a large number of cables are connected to computing modules in the rack, cooling airflow can be obstructed and computing modules can overheat and fail.

SUMMARY

The following presents a simplified summary of one or more embodiments in order to provide a basic understanding of present technology. This summary is not an extensive overview of all contemplated embodiments of the present technology, and is intended to neither identify key or critical elements of all examples nor delineate the scope of any or all aspects of the present technology. Its sole purpose is to present some concepts of one or more examples in a simplified form as a prelude to the more detailed description that is presented later.

In some implementations, a system is provided for cable management in server rack architecture. The system can include a rear panel of a housing that includes a first compartment and a second compartment. The system can further include a first module of a first type coupled to the first compartment and a second module of a second type coupled to the second compartment. The first compartment can be configured to couple to modules of the first type and the second type, and the second compartment can be configured to couple to modules of the first type and the second type. Thus, each compartment can be configured to accept different types of modules.

In some implementations, the first module can be rearranged to couple to the second compartment and the second module can be rearranged to couple to the first compartment.

In some implementations, the system can further include a third compartment and a fourth compartment in the rear panel. The system can further include a third module of the first type coupled to the third compartment and a fourth module of the second type coupled to the fourth compartment. The third compartment can be configured to couple to modules of the first type and the second type, and the fourth compartment can be configured to couple to modules of the first type and the second type.

BRIEF DESCRIPTION OF THE DRAWINGS

These and other sample aspects of the present technology will be described in the detailed description and the appended claims that follow, and in the accompanying drawings, wherein:

DETAILED DESCRIPTION

The subject disclosure describes techniques for cable management in server rack architecture. In the following description, for purposes of explanation, numerous specific details are set forth in order to provide a thorough understanding of one or more aspects of techniques for cable management in server rack architecture. It can be evident, however, that the present technology can be practiced without these specific details. In other instances, well-known structures and devices are shown in block diagram form in order to facilitate describing these aspects.

Computer server systems in modern data centers are commonly mounted in specific (e.g., fixed) configurations on server racks for which a number of computing modules, such as trays, are positioned and stacked relative on top of each other within the server racks. Rack mounted systems allow for a vertical arrangement of the computing modules to use space efficiently. Generally, each computing module can be slid into and out of the server rack, and various cables such as input/output (IO) cables, network cables, power cables, etc., can connect to the computing modules at the rear of the server rack. Each computing module can contain one or more computer servers or may hold one or more computer server components. A large number of cables can be coupled to numerous connector modules at the rear of each server rack. The large number of cables connected to cable ports of connector modules located at various areas of the server rack may be difficult to organize and may become entangled and therefore easily damaged or disconnected. The large number of cables can obstruct cooling airflow and cause overheating which can result in damage to system components.

Figure 1:
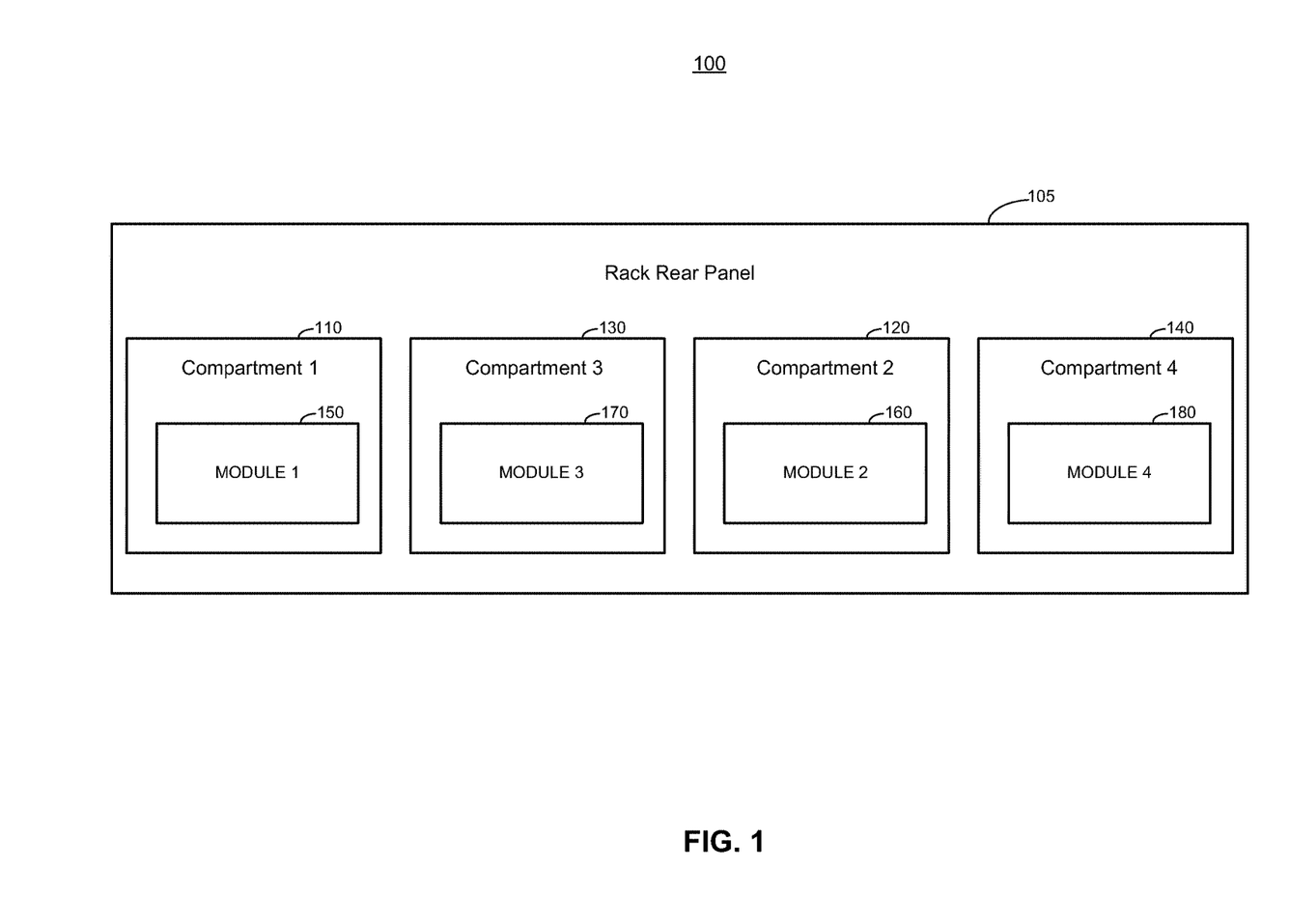
FIG. 1 illustrates a block diagram of an example system for cable management in server rack architecture.

FIG. 1 illustrates a block diagram of an example system 100 for cable management in server rack architecture. For example, the system 100 may be part of a server rack in a data center. The system 100 can include a rack rear panel 105. The rack rear panel 105 can be located at a rear of a server rack. The rack rear panel 105 can include one or more fan modules (not shown) for cooling the system 100. Each fan module can function as active cooling to expel warm air from inside the server rack and to intake cool air from outside the server rack. Fans of varying sizes and arrangements can be used.

Rack rear panel 105 can include multiple compartments 110, 120, 130, and 140. Each of the compartments 110, 120, 130, and 140 can be configured to couple to one of a number of modules 150, 160, 170, and 180. In some implementations, each of the compartments 110, 120, 130, and 140 can include a recess that allows insertion of one of the modules 150, 160, 170, and 180. In some implementations, the modules 150, 160, 170, and 180 can have a similar height and width to allow interchangeability and rearrangement of the modules within compartments 110, 120, 130, and 140.

In some implementations, the modules 150, 160, 170 and 180 can provide different types of functionality to computing modules of the server rack. For example, one or more of the modules 150, 160, 170, and 180 can be control modules. A control module can be, for example, a storage control module that allows computing modules of a server to communicate with storage devices such as hard disk drives, tape drives, or solid state drives. For example, each storage control module can communicate with a number of storage devices using one or more data transferring interfaces such as Small Computer System Interface (SCSI), Serial Attached SCSI (SAS), parallel SCSI, parallel advanced technology attachment (PATA), serial ATA (SATA). In some implementations, a storage control module can include a SAS expander that allows the storage control module to support a large number (e.g., 128) of storage devices.

In some implementations, one or more modules 150, 160, 170, and 180 can be connector modules. For example, the connector module can include various cable connector ports (e.g., Ethernet, Gigabit Ethernet, Universal Serial Bus (USB), or IEEE 1394) that allow the computing modules of the server rack to communicate with other computing devices and/or network elements.

Figure 2:
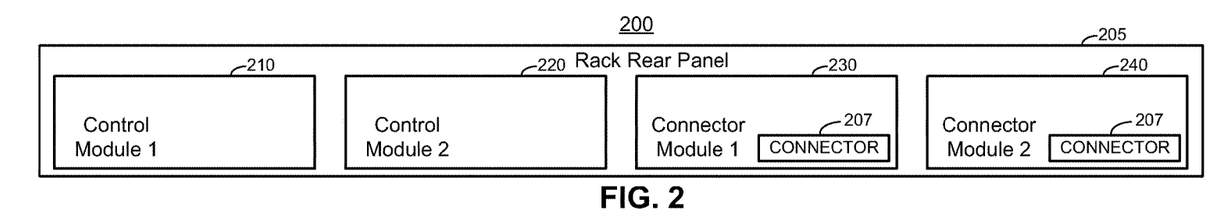
FIG. 2 illustrates a block diagram of an example module configuration that routes cables to a right side of a rack rear panel.

FIG. 2 illustrates a block diagram 200 of an example module configuration that routes cables to a right side of a rack rear panel 205. In system 200, control modules 210, 220 can be installed on a left side of the rack rear panel 205. Connector modules 230, 240 can be installed on the right side of the rack rear panel 205. For example, the first control module 210 and second control module 220 can be arranged to be left of the first connector module 230 and the second connector module 240.

Each connector module 230, 240 can include a connector port 207 that allows the coupling of cables to the connector modules 230, 240 of rack rear panel 205. As illustrated by system 200, the connector modules 230, 240 can be arranged on the right side of rack rear panel 205 so that cables coupled to rack rear panel 205 can all be routed along the right side of rack rear panel 205. This arrangement can leave the left side of the rack unobstructed with cables so that air can flow through the rack to cool various heat generating components.

Figure 3:
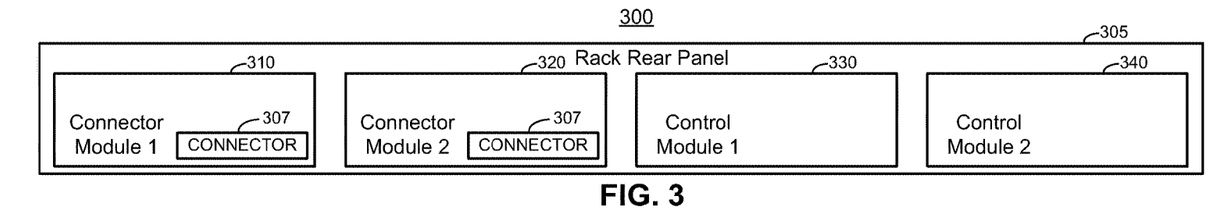
FIG. 3 illustrates a block diagram of an example module configuration that routes cables to a left side of a rack rear panel.

FIG. 3 illustrates a block diagram 300 of an example module configuration that routes cables to a left side of a rack rear panel 305. In system 300, control modules 330, 340 can be installed on a right side of the rack rear panel 305. Connector modules 310, 320 can be installed on the left side of the rack rear panel 305. For example, the first control module 330 and second control module 340 can be arranged to be right of the first connector module 310 and the second connector module 320.

Each connector module 310, 320 can include a connector port 307 that allows the coupling of cables to the connector modules 310, 320 of rack rear panel 305. As illustrated by system 300, the connector modules 310, 320 can be arranged on the left side of rack rear panel 305 so that cables coupled to rack rear panel 305 can all be routed along the left side of rack rear panel 305. This arrangement can leave the right side of the rack unobstructed with cables so that air can flow through the rack to cool various heat generating components.

Figure 4:
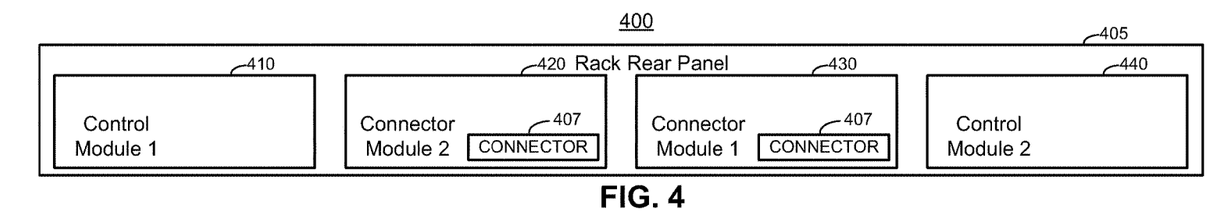
FIG. 4 illustrates a block diagram of an example module configuration that routes cables to a middle area of a rack rear panel.

FIG. 4 illustrates a block diagram 400 of an example module configuration that routes cables to a middle area of a rack rear panel 405. In system 400, connector modules 420, 430 can be installed between control modules 410, 440 on the rack rear panel 405. For example, the first connector module 430 and the second connector module 420 can be arranged between the first control module 410 and second control module 440.

Each connector module 420, 430 can include a connector port 407 that allows the coupling of cables to the connector modules 420, 430 of rack rear panel 405. As illustrated by system 400, the connector modules 420, 430 can be arranged in the center region of rack rear panel 405 so that cables coupled to rack rear panel 405 can all be routed along a center area of rack rear panel 405. This arrangement can leave the right and left edges of the rear panel unobstructed with cables so that air can flow through the rack to cool various heat generating components.

Figure 5:
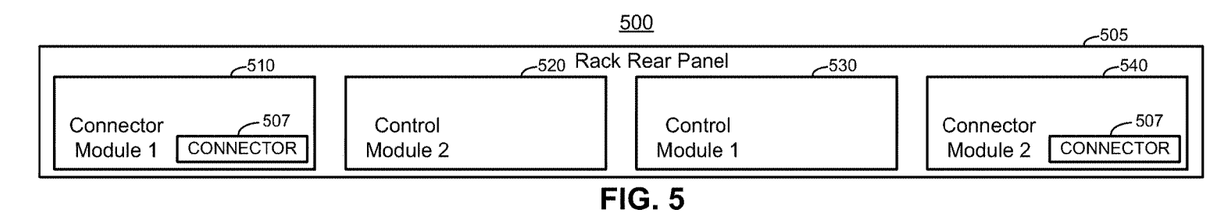
FIG. 5 illustrates a block diagram of an example module configuration that routes cables to a left and right side of a rack rear panel.

FIG. 5 illustrates a block diagram 500 of an example module configuration that routes cables to a left and right side of a rack rear panel 505. In system 500, control modules 520, 530 can be installed between connector modules 510, 540 on the rack rear panel 505. For example, the first control module 530 and second control module 520 can be arranged between the first connector module 510 and the second connector module 540.

Each connector module 510, 540 can include a connector port 507 that allows the coupling of cables to the connector modules 510, 540 of rack rear panel 505. As illustrated by system 500, the connector modules 510, 540 can be arranged to the left and right sides of rack rear panel 505 so that cables coupled to rack rear panel 505 can all be routed along a left and right side of rack rear panel 505. This arrangement can leave the center of the rear panel unobstructed with cables so that air can flow through the rack to cool various heat generating components.

In some implementations, systems 200, 300, 400 and 500 described above for FIGS. 2-5 can represent the same system where control modules and connector modules have been rearranged to suit different cabling organization schemes. For example, the connector modules and control modules can be interchangeable such that a connector module in one compartment can be replaced with a control module in the same compartment. To support such interchangeability, the rack rear panel and the rack itself can be configured with universal or common couplings that allow one compartment to accept either/both control module and/or connector module.

Figure 6:
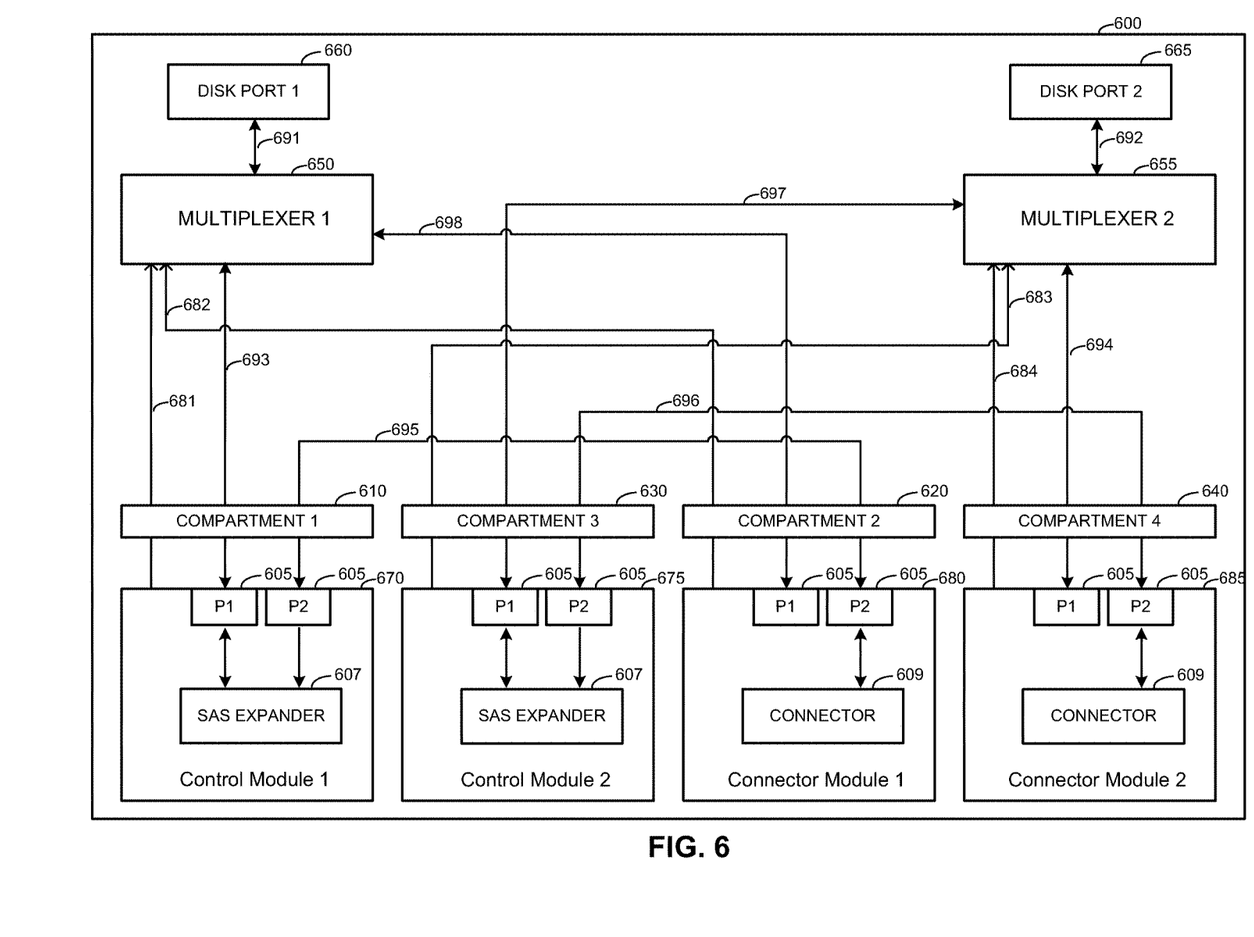
FIG. 6 illustrates a block diagram of an example system that uses multiplexers to allow for interchangeability of modules between compartments.

FIG. 6 illustrates a block diagram of an example system 600 that uses multiplexers to allow for interchangeability of modules between compartments. The system 600 can be a rack rear panel that includes multiple compartments 610, 620, 630, 640. An interchangeable module (i.e., control module or connector module) 670, 675, 680, 685 can be installed into each of the compartments 610, 620, 630, 640. The four configurations shown in FIGS. 2-5 can all be supported by system 600.

The system 600 can further include a first multiplexer 650 and a second multiplexer 655 for routing signals (e.g., data, messages, etc.) from the interchangeable modules 670, 675, 680, 685 in the compartments 610, 620, 630, 640 to a first disk port 660 and a second disk port 665. In some implementations, the system 600 can include any number of disk ports and multiplexers. In some implementations the number of control modules can equal the number of connector modules.

In an example configuration of modules installed in compartments, as shown in FIG. 6, the first control module 670 can be coupled to the first compartment 610, the first connector module 680 can be coupled to the second compartment 620, the second control module 675 can be coupled to the third compartment 630, and the second connector module 685 can be coupled to the fourth compartment 640. The system 600 can also use any other arrangement order of control modules 670, 675 and connector modules 680, 685 installed in the compartments 610, 620, 630, and 640.

Each control module 670, 675 can be, for example a storage control module that allows computing modules of a server to communicate with storage devices such as hard disk drives, tape drives, or solid state drives. For example, each control module 670, 675 can communicate with a number of storage devices using one or more data transferring interfaces such as SAS, parallel SCSI, SATA, Fibre Channel, Ethernet or PCIe. In a related aspect, each control module 670, 675 can include a SAS expander 607 that allows the control modules 670, 675 to support a large number (e.g., 64, 128, 256, etc.) of storage devices. Each connector module 680, 685 can include various cable connector ports (e.g., Ethernet, Gigabit Ethernet, USB, or IEEE 1394, SAS, PCIe and Fibre Channel) 609. The control modules 670, 675 and the connector modules 680, 685 can each include at least one connector port 605.

The first multiplexer 650 can function to connect the first disk port 660 to a control module. However, the system 600 can allow interchangeability of the modules between the compartments. Because the first multiplexer 650 can be connected to both the first compartment 610 and the second compartment 620, the first multiplexer 650 can first determine which of the first compartment 610 and the second compartment 620 is coupled to a control module, in order to route signals from a control module, and not signals from a connector module, to the first disk port 660. The first multiplexer module 650 can route whichever compartment is indicated by the identifiers to include a control module to the first disk port 660.

To determine which of the first compartment 610 and the second compartment 620 is coupled to a control module, the first multiplexer module 650 can receive a first identifier, through connection 681, from a module (e.g., the first control module 670 in the example illustrated by FIG. 6) installed in the first compartment 610 that identifies the module as a connector module or a control module. For example, the first control module 670 may send an identifier (e.g., IS_CTRL=1) to the first multiplexer module 650 that specifies that the module installed in the first compartment 610 is a control module and not a connector module.

Similarly, the first multiplexer module 650 can receive a second identifier, through connection 682, from a module (e.g., the first connector module 680 in the example illustrated by FIG. 6) installed in the second compartment 620 that identifies the module as a connector module or a control module. For example, the first connector module 680 may send an identifier (e.g., IS_CTRL=0) to the first multiplexer module 650 that specifies that the module installed in the second compartment 620 is a connector module and not a control module.

Similarly, the second multiplexer 655 can function to connect the second disk port 665 to control module. Because the second multiplexer 655 can be connected to both the third compartment 630 and the fourth compartment 640, the second multiplexer 655 can first determine which of the third compartment 630 and the fourth compartment 640 is coupled to a control module, in order to route signals from a control module, and not signals from a connector module, to the second disk port 665. The second multiplexer module 655 can route whichever compartment is indicated by the identifiers to include a control module to the second disk port 665.

To determine which of the third compartment 630 and the fourth compartment 640 is coupled to a control module, the second multiplexer module 655 can receive a third identifier, through connection 683, from a module (e.g., the second control module 675 in the example illustrated by FIG. 6) installed in the third compartment 630 that identifies the module as a connector module or a control module. For example, the second control module 675 may send an identifier (e.g., IS_CTRL=1) to the second multiplexer module 655 that specifies that the module installed in the third compartment 630 is a control module and not a connector module.

The second multiplexer module 655 can receive a fourth identifier, through connection 684, from a module (e.g., the second connector module 685 in the example illustrated by FIG. 6) installed in the fourth compartment 640 that identifies the module as a connector module or a control module. For example, the second connector module 685 may send an identifier (e.g., IS_CTRL=0) to the second multiplexer module 655 that specifies that the module installed in the fourth compartment 640 is a connector module and not a control module.

The first multiplexer 650 can connect to the first disk port 660 through connection 691. The first multiplexer 650 can connect to the first compartment 610 and the first control module 670 through connection 693. The first multiplexer 650 can connect to the second compartment 620 and the first connector module 680 through connection 698.

The second multiplexer 655 can connect to the second disk port 665 through connection 692. The second multiplexer 655 can connect to the third compartment 630 and the second control module 675 through connection 697. The second multiplexer 655 can connect to the fourth compartment 640 and the second connector module 685 through connection 694.

Connection 695 can connect the first compartment 610 to the second compartment 620, and thus connector port P2 of the first control module 670 to connector port P2 of the first connector module 680. As shown in FIG. 6, connection 695 allows the first control module 670, when coupled to the first compartment 610, to process signals from the first connector module 680 coupled to the second compartment 620. Although not shown in FIG. 6, connection 695 also allows the first control module 670, when coupled to the second compartment 620, to process signals from the first connector module 680 coupled to the first compartment 610.

Connection 696 can connect the third compartment 630 to the fourth compartment 640, and thus connector port P2 of the second control module 675 to connector port P2 of the second connector module 685. As shown in FIG. 6, connection 696 allows the second control module 675, when coupled to the third compartment 630, to process signals from the second connector module 685 coupled to the fourth compartment 640. Although not shown in FIG. 6, connection 696 also allows the second control module 675, when coupled to the fourth compartment 640, to process signals from the second connector module 685 coupled to the third compartment.

Figure 7:
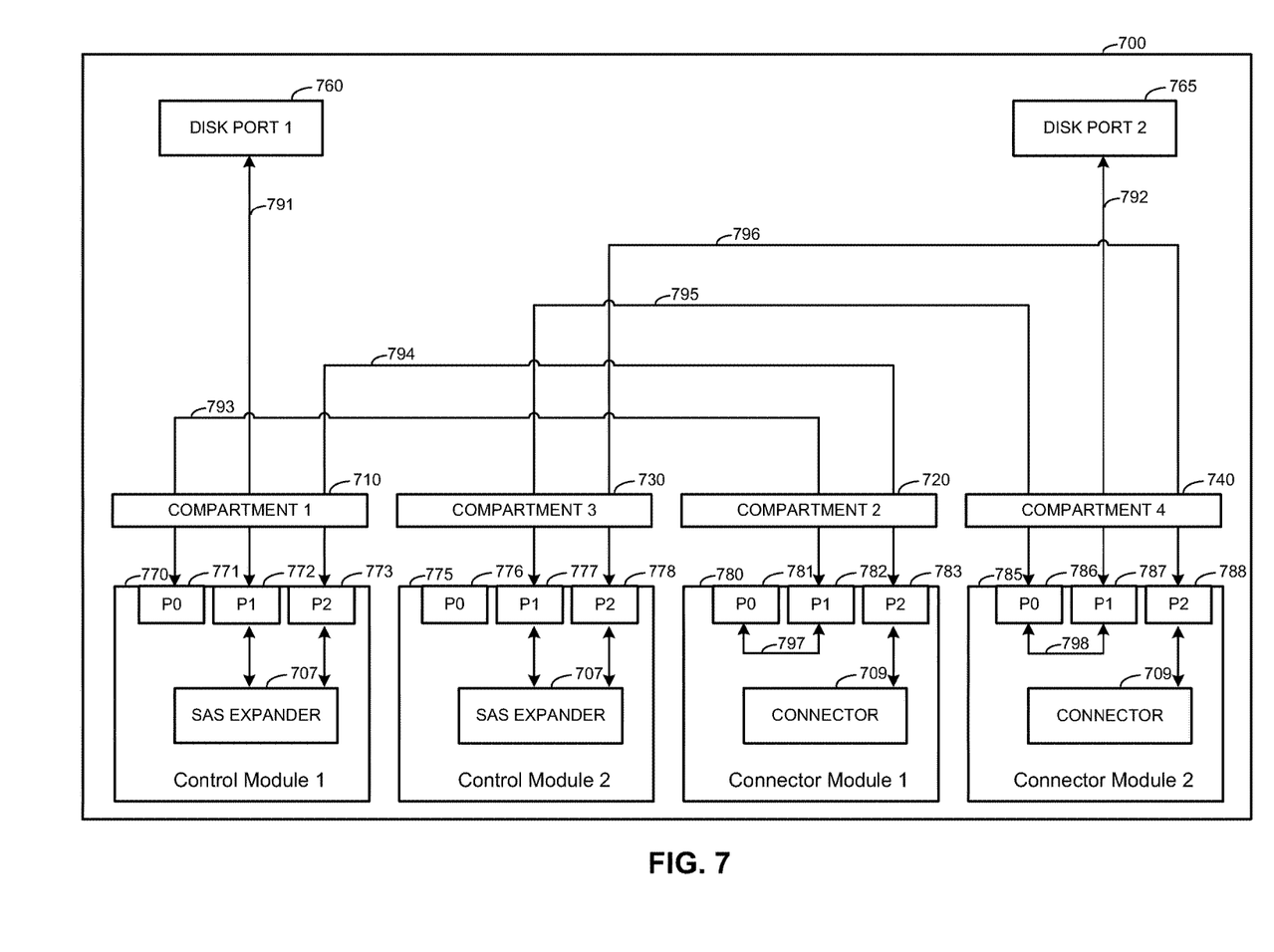
FIG. 7 illustrates a block diagram of an example system with specific connections that allow for interchangeability of modules between compartments.

FIG. 7 illustrates a block diagram of an example system 700 with specific connections that allow for interchangeability of modules between compartments. The system 700 can be a rack rear panel that includes multiple compartments 710, 720, 730, 740. An interchangeable module (i.e., control module or connector module) 770, 775, 780, 785 can be installed into each of the compartments 710, 720, 730, 740. The four configurations shown in FIGS. 2-5 can all be supported by system 700.

The system 700 can include a specific arrangement of connections for routing the interchangeable modules 770, 775, 780, 785 in the compartments 710, 720, 730, 740 to a first disk port 760 and a second disk port 765. In some implementations, the system 700 can include any number of disk ports. In some implementations the number of control modules can equal the number of connector modules.

The specific arrangement of connections in system 700 as shown in FIG. 7 can allow the system 700 to function the same when the modules in the first compartment 710 and the second compartment 720 are swapped and/or when the modules in the third compartment 730 and the fourth compartment 740 are swapped. The system 700 can allow the specific arrangement of connections to be unchanged after swapping. However, the system 700 may not allow a module in the second compartment 720 to be swapped with a module in the third compartment 730 (which forms an arrangement order of: control module, connector module, control module, connector module). The system 700 may also not allow a module in the first compartment 710 to be swapped with a module in the fourth compartment 740 (which forms an arrangement order: of connector module, control module, connector module, control module). Thus, by allowing one module (e.g., a control module) to forward signals for a paired module (e.g., a control module and a connector module), the connections of system 700 can allow for each of the module arrangements illustrated by FIGS. 2-5.

In an example configuration of modules installed in compartments, as shown in FIG. 7, the first control module 770 can be coupled to the first compartment 710, the first connector module 780 can be coupled to the second compartment 720, the second control module 775 can be coupled to the third compartment 730, and the second connector module 785 can be coupled to the fourth compartment 740. The system 700 may use any arrangement order of control modules 770, 775 and connector modules 780, 785 installed in the compartments 710, 720, 730, and 740.

Each control module 770, 775 can be, for example a storage control module that allows computing modules of a server to communicate with storage devices such as hard disk drives, tape drives, or solid state drives. For example, each control module 770, 775 can communicate with a number of storage devices using one or more data transferring interfaces such as SAS, parallel SCSI, SATA, Fibre Channel, Ethernet or PCIe. In a related aspect, each control module 770, 775 can include a SAS expander 707 that allows the control modules 770, 775 to support a large number (e.g., 64, 128, 256, etc) of storage devices. Each connector module 780, 785 can include various cable connector ports (e.g., Ethernet, Gigabit Ethernet, USB, or IEEE 1394, SAS, Fibre Channel, PCIe) 709. The control modules 770, 775 and the connector modules 780, 785 can each include at least one connector port (e.g., P0, P1, P2 on each connector module) 771-773, 776-778, 781-783, 786-788.

The first disk port 760 can connect to the first compartment 710 and connector port P1 772 of the first control module 770 through connection 791. Connection 794 can connect the first compartment 710 to the second compartment 720, and thus connector port P2 773 of the first control module 770 to connector port P2 783 of the first connector module 780. Connection 793 can also connect the first compartment 710 to the second compartment 720, and thus connector port P0 771 of the first control module 770 to connector port P1 782 of the first connector module 780. Connection 797 can connect connector port P0 781 of the first connector module 780 to connector port P1 782 of the first connector module 780.

As shown in FIG. 7, connection 794 allows the first control module 770, when coupled to the first compartment 710, to process signals from the first connector module 780 coupled to the second compartment 720. Although not shown in FIG. 7, connection 794 also allows the first control module 770, when coupled to the second compartment 720, to process signals from the first connector module 780 coupled to the first compartment 710.

As shown in FIG. 7, connection 793 is not used when the first control module 770 is coupled to the first compartment 710 and the first connector module 780 is coupled to the second compartment 720. Although not shown in FIG. 7, when modules coupled to the first compartment 710 and the second compartment 720 are swapped (i.e., the first control module 770 is coupled to the second compartment 720 and the first connector module 780 is coupled to the first compartment 710), connection 793 and connection 797 allow the first connector module 780 to forward signals from connector port P1 772 of the first control module 770 to the first disk port 760.

The second disk port 765 can connect to the fourth compartment 740 and connector port P1 787 of the second connector module 785 through connection 792. Connection 796 can connect the third compartment 730 to the fourth compartment 740, and thus connector port P2 778 of the second control module 775 to connector port P2 788 of the second connector module 785. Connection 795 can also connect the third compartment 730 to the fourth compartment 740, and thus connector port P1 777 of the second control module 775 to connector port P0 786 of the second connector module 785. Connection 798 can connect connector port P0 786 of the second connector module 785 to connector port P1 787 of the second connector module 785.

As shown in FIG. 7, connection 796 allows the second control module 775, when coupled to the third compartment 730, to process signals from the second connector module 785 coupled to the fourth compartment 740. Although not shown in FIG. 7, connection 796 also allows the second control module 775, when coupled to the fourth compartment 740, to process signals from the second connector module 785 coupled to the third compartment 730.

Connection 795 and connection 798 allow the second connector module 785 to forward signals from connector port P1 777 of the second control module 775 to the second disk port 765. Although not shown in FIG. 7, connection 795 is not used when the second control module 775 is coupled to the fourth compartment 740 and the second connector module 785 is coupled to the third compartment 730 (i.e., when modules coupled to the third compartment 730 and the fourth compartment 740 are swapped).

Figure 8:
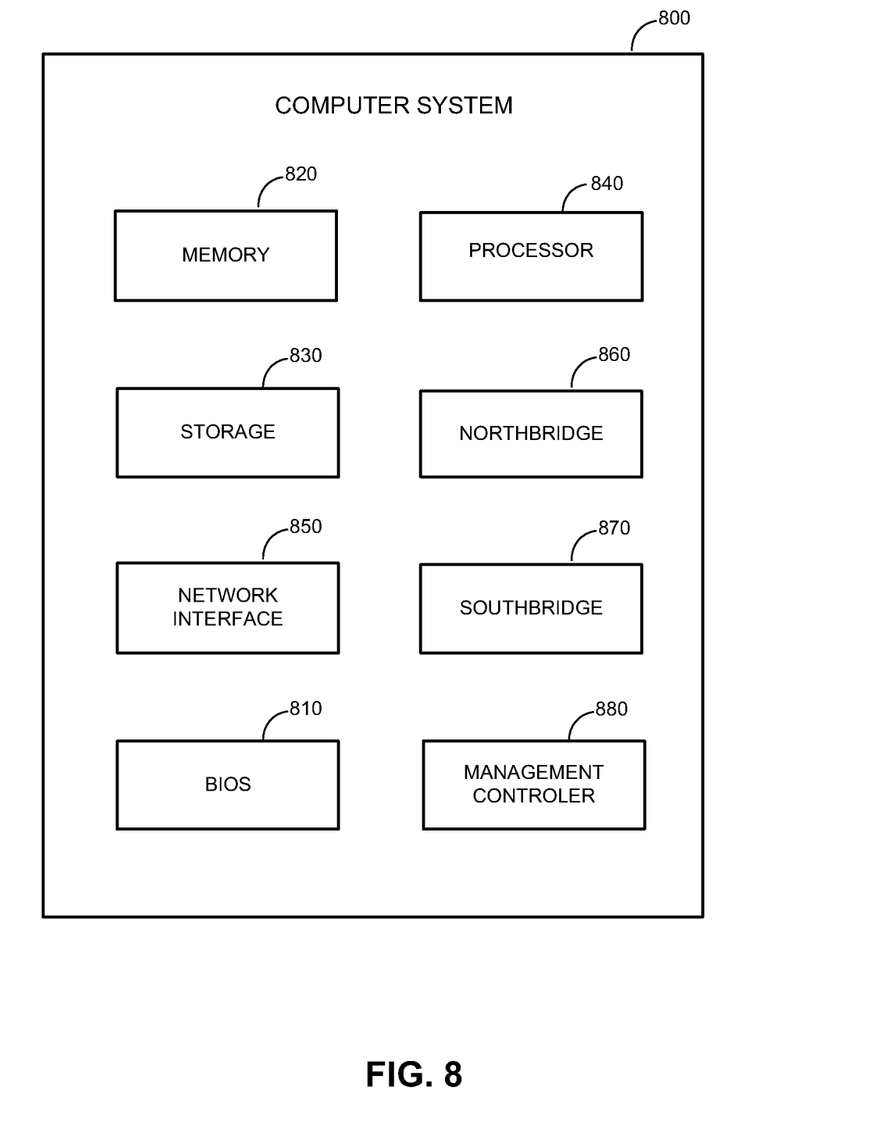
FIG. 8 illustrates a block diagram of an example computer system.

FIG. 8 illustrates a block diagram of an example computer system 800. The computer system 800 can include a processor 840, a network interface 850, a management controller 880, a memory 820, a storage 830, a BIOS 810, a northbridge 860, and a southbridge 870.

The computer system 800 can be, for example, a server (e.g., a server in a server rack of a data center) or a personal computer. The processor (e.g., central processing unit (CPU)) 840 can be a chip on a motherboard that can retrieve and execute programming instructions stored in the memory 820. The processor 840 can be a single CPU with a single processing core, a single CPU with multiple processing cores, or multiple CPUs. One or more buses (not shown) can transmit instructions and application data between various computer components such as the processor 840, memory 820, storage 830, and networking interface 850.

The memory 820 can include any physical device used to temporarily or permanently store data or programs, such as various forms of random-access memory (RAM). The storage 830 can include any physical device for non-volatile data storage such as a HDD or a flash drive. The storage 830 can have a greater capacity than the memory 820 and can be more economical per unit of storage, but can also have slower transfer rates.

The BIOS 810 can include a Basic Input/Output System or its successors or equivalents, such as an Extensible Firmware Interface (EFI) or Unified Extensible Firmware Interface (UEFI). The BIOS 810 can include a BIOS chip located on a motherboard of the computer system 800 storing a BIOS software program. The BIOS 810 can store firmware executed when the computer system is first powered on along with a set of configurations specified for the BIOS 810. The BIOS firmware and BIOS configurations can be stored in a non-volatile memory (e.g., NVRAM) or a ROM such as flash memory. Flash memory is a non-volatile computer storage medium that can be electronically erased and reprogrammed.

The BIOS 810 can be loaded and executed as a sequence program each time the computer system 800 is started. The BIOS 810 can recognize, initialize, and test hardware present in a given computing system based on the set of configurations. The BIOS 810 can perform self-test, such as a Power-on-Self-Test (POST), on the computer system 800. This self-test can test functionality of various hardware components such as hard disk drives, optical reading devices, cooling devices, memory modules, expansion cards and the like. The BIOS can address and allocate an area in the memory 820 in to store an operating system. The BIOS 810 can then give control of the computer system to the OS.

The BIOS 810 of the computer system 800 can include a BIOS configuration that defines how the BIOS 810 controls various hardware components in the computer system 800. The BIOS configuration can determine the order in which the various hardware components in the computer system 800 are started. The BIOS 810 can provide an interface (e.g., BIOS setup utility) that allows a variety of different parameters to be set, which can be different from parameters in a BIOS default configuration. For example, a user (e.g., an administrator) can use the BIOS 810 to specify clock and bus speeds, specify what peripherals are attached to the computer system, specify monitoring of health (e.g., fan speeds and CPU temperature limits), and specify a variety of other parameters that affect overall performance and power usage of the computer system.

The management controller 880 can be a specialized microcontroller embedded on the motherboard of the computer system. For example, the management controller 880 can be a baseboard management controller (BMC). The management controller 880 can manage the interface between system management software and platform hardware. Different types of sensors built into the computer system can report to the management controller 880 on parameters such as temperature, cooling fan speeds, power status, operating system status, etc. The management controller 880 can monitor the sensors and have the ability to send alerts to an administrator via the network interface 850 if any of the parameters do not stay within preset limits, indicating a potential failure of the system. The administrator can also remotely communicate with the management controller 880 to take some corrective action such as resetting or power cycling the system to restore functionality.

The northbridge 860 can be a chip on the motherboard that can be directly connected to the processor 840 or can be integrated into the processor 840. In some instances, the northbridge 860 and the southbridge 870 can be combined into a single die. The northbridge 860 and the southbridge 870, manage communications between the processor 840 and other parts of the motherboard. The northbridge 860 can manage tasks that require higher performance than the southbridge 870. The northbridge 860 can manage communications between the processor 840, the memory 820, and video controllers (not shown). In some instances, the northbridge 860 can include a video controller.

The southbridge 870 can be a chip on the motherboard connected to the northbridge 860, but unlike the northbridge 860, is not directly connected to the processor 840. The southbridge 870 can manage input/output functions, such as Universal Serial Bus (USB), audio, serial, BIOS, Serial Advanced Technology Attachment (SATA), Peripheral Component Interconnect (PCI) bus, PCI eXtended (PCI-X) bus, PCI Express bus, ISA bus, SPI bus, eSPI bus, SMBus, of the computer system 800. The southbridge 870 can connect to or can include within the southbridge 870 the management controller 870, Direct Memory Access (DMAs) controllers, Programmable Interrupt Controllers (PICS), and a real-time clock.

The various illustrative logical blocks, modules, and circuits described in connection with the disclosure herein can be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any conventional processor, controller, microcontroller, or state machine. A processor can also be implemented as a combination of computing devices, e.g., a combination of a DSP and a microprocessor, a plurality of microprocessors, one or more microprocessors in conjunction with a DSP core, or any other such configuration.

The operations of a method or algorithm described in connection with the disclosure herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium known in the art. An example storage medium is coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal.

In one or more example designs, the functions described can be implemented in hardware, software, firmware, or any combination thereof. If implemented in software, the functions can be stored on or transmitted over as one or more instructions or code on a non-transitory computer-readable medium. Non-transitory computer-readable media includes both computer storage media and communication media including any medium that facilitates transfer of a computer program from one place to another. A storage media can be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Disk and disc, as used herein, includes compact disc (CD), laser disc, optical disc, digital versatile disc (DVD), floppy disk and blue ray disc where disks usually reproduce data magnetically, while discs reproduce data optically with lasers. Combinations of the above should also be included within the scope of non-transitory computer-readable media.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. A system comprising:
a rear panel of a housing comprising a first compartment and a second compartment;
a first module of a first type coupled to the first compartment; and
a second module of a second type coupled to the second compartment,
wherein the first compartment is capable of coupling to modules of both the first type and the second type, the first type being a control module comprising at least one control input/output interface, the second type being a connector module comprising at least one input/output cable port,
wherein the second compartment is capable of coupling to modules of both the first type and the second type, and
wherein the first compartment is a first recess that allows insertion of the first module in its entirety, wherein the second compartment is a second recess that allows insertion of the second module in its entirety, and wherein the first recess and the second recess are separate recesses, and are not overlapped with each other.

2. The system of claim 1, wherein the first module allows for rearrangement to couple to the second compartment and the second module allows for rearrangement to couple to the first compartment.

3. The system of claim 1, wherein the first type is a control module comprising at least one control input/output interface and the second type is a connector module comprising at least one input/output cable port.

4. The system of claim 3, wherein the control module connects to a disk port and processes signals from the connector module.

5. The system of claim 1, wherein the first type comprises one of a Serial Attached Small Computer System Interface (SAS) expander, a PCIe switch, or an Ethernet switch.

6. The system of claim 1, further comprising a disk port.

7. The system of claim 1, further comprising:
a third compartment and a fourth compartment in the rear panel;
a third module of the first type coupled to the third compartment; and
a fourth module of the second type coupled to the fourth compartment,
wherein the third compartment is configured to couple to modules of the first type and the second type, and
wherein the fourth compartment is configured to couple to modules of the first type and the second type.

8. The system of claim 7, wherein the third module allows for rearrangement to couple to the fourth compartment and the fourth module allows for rearrangement to couple to the third compartment.

9. The system of claim 1, further comprising a first multiplexer that is connected to both the first compartment and the second compartment, the first multiplexer configured to determine whether the first module or the second module is a control module in order to route signals from the control module.

10. A system comprising:
a first compartment of a rear panel, wherein the first compartment is capable of coupling to modules of both a first type and a second type, the first type being a control module comprising at least one control input/output interface, the second type being a connector module comprising at least one input/output cable port;
a second compartment of the rear panel, wherein the second compartment is capable of coupling to modules of both the first type and the second type;
a first module of the first type;
a second module of the second type; and
a detection module that determines which of the first type and the second type of module is coupled to the first compartment, and determines which of the first type and the second type of module is coupled to the second compartment,
wherein the first compartment is a first recess that allows insertion of the first module in its entirety, wherein the second compartment is a second recess that allows insertion of the second module in its entirety, and wherein the first recess and the second recess are separate recesses, and are not overlapped with each other.

11. The system of claim 10, wherein the first type is a control module comprising at least one control input/output interface and the second type is a connector module comprising at least one input/output cable port.

12. The system of claim 10, wherein the detection module comprises a multiplexer module connected to the first compartment and to the second compartment.

13. The system of claim 12, wherein the multiplexer module receives a first identifier from the first compartment that identifies which of the first type and the second type of module is coupled to the first compartment, and receives a second identifier from the second compartment that identifies which of the first type and the second type of module is coupled to the second compartment.

14. The system of claim 12, further comprising a disk port connected to the multiplexer module.

15. The system of claim 14, wherein the multiplexer module connects the disk port to which of the first compartment and the second compartment determined to couple to the first type of module.

16. A system comprising:
a disk port;
a first compartment of a rear panel, wherein the first compartment is coupled to the disk port and is capable of coupling to modules of both a first type and a second type, the first type being a control module comprising at least one control input/output interface, the second type being a connector module comprising at least one input/output cable port;
a second compartment of the rear panel, wherein the second compartment is coupled to the first compartment and is capable of coupling to modules of both the first type and the second type;
a first module of the first type; and
a second module of the second type,
wherein the first module processes signals from the second module, and
wherein the second module, when coupled to the first compartment, forwards signals from the first module to the disk port,
wherein the first compartment is a first recess that allows insertion of the first module in its entirety, wherein the second compartment is a second recess that allows insertion of the second module in its entirety, and wherein the first recess and the second recess are separate recesses, and are not overlapped with each other.

17. The system of claim 16, wherein the first type is a control module comprising at least one control input/output interface and the second type is a connector module comprising at least one input/output cable port.

18. A system comprising:
a first compartment of a rear panel, wherein the first compartment is capable of coupling to modules of both a first type and a second type, the first type being a control module comprising at least one control input/output interface, the second type being a connector module comprising at least one input/output cable port;
a second compartment of the rear panel, wherein the third compartment is capable of coupling to modules of both the first type and the second type;
a third compartment of the rear panel, wherein the second compartment is configured to couple to modules of the first type and the second type;
a fourth compartment of the rear panel, wherein the fourth compartment is configured to couple to modules of the first type and the second type;
a first module of the second type coupled to the first compartment;
a second module of the first type coupled to the third compartment;
a third module of the first type coupled to the second compartment; and
a fourth module of the second type coupled to the fourth compartment,
wherein the first compartment is a first recess that allows insertion of the first module in its entirety, wherein the second compartment is a second recess that allows insertion of the second module in its entirety, wherein the third compartment is a third recess that allows insertion of the third module in its entirety, wherein the fourth compartment is a second recess that allows insertion of the fourth module in its entirety, and wherein the first recess, the second recess, the third recess and the fourth recess are separate recesses, and are not overlapped with each other.

19. The system of claim 18, wherein compartments are ordered from left to right: first compartment, third compartment, second compartment, and fourth compartment.

20. The system of claim 18, wherein the first type is a control module comprising at least one control input/output interface and the second type is a connector module comprising at least one input/output cable port.

21. The system of claim 20, wherein cables leading to connector modules route to a left and right side of the rear panel.

* * * * *